(12) United States Patent
Van Herpen et al.

(10) Patent No.: US 8,748,922 B2
(45) Date of Patent: Jun. 10, 2014

(54) LIGHT OUTPUT DEVICE

(75) Inventors: Maarten Marinus Johannes Wilhelmus Van Herpen, Eindhoven (NL); Ferry Zijp, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 945 days.

(21) Appl. No.: 12/674,940

(22) PCT Filed: Aug. 28, 2008

(86) PCT No.: PCT/IB2008/053489
§ 371 (c)(1),
(2), (4) Date: Feb. 24, 2010

(87) PCT Pub. No.: WO2009/031084
PCT Pub. Date: Mar. 12, 2009

(65) Prior Publication Data
US 2011/0127552 A1  Jun. 2, 2011

(30) Foreign Application Priority Data
Sep. 4, 2007  (EP) .................................. 07115596

(51) Int. Cl.
*H01L 29/207*  (2006.01)
(52) U.S. Cl.
USPC ...................... 257/98; 257/100; 257/E33.074

(58) Field of Classification Search
USPC ......................... 257/79, 88, 98, 100, E33.074
See application file for complete search history.

(56) References Cited

U.S. PATENT DOCUMENTS

| | | | |
|---|---|---|---|
| 6,867,542 B1 * | 3/2005 | Sun et al. ..................... 313/512 |
| 7,196,354 B1 | 3/2007 | Erchak et al. | |
| 8,093,789 B2 * | 1/2012 | Van Herpen et al. ........... 313/46 |
| 2003/0020081 A1 | 1/2003 | Guida | |
| 2003/0218192 A1 | 11/2003 | Reilly et al. | |
| 2007/0025108 A1 | 2/2007 | Kingsford et al. | |
| 2007/0041191 A1 | 2/2007 | Okada | |

FOREIGN PATENT DOCUMENTS

| | | |
|---|---|---|
| EP | 1538682 A2 | 6/2005 |
| EP | 1737049 A1 | 12/2006 |
| JP | 2001189563 A | 10/2001 |
| WO | 2007071724 A1 | 6/2007 |

\* cited by examiner

*Primary Examiner* — Jack Chen
(74) *Attorney, Agent, or Firm* — David Zivan; Mark Beloborodov

(57) ABSTRACT

The present invention relates to a light output device (100) comprising a LED package (4) at least partly embedded in a translucent layer (5) of a thermoplastic material, characterized in that the translucent layer (5) comprises light scattering particles (6) having a higher thermal conductivity than the thermal conductivity of the thermoplastic material of the translucent layer (5).

9 Claims, 2 Drawing Sheets

LIGHT OUTPUT DEVICE

FIELD OF THE INVENTION

The present invention relates to a light output device, in particular to a light output device comprising a LED package at least partly embedded in a translucent layer of a thermoplastic material.

BACKGROUND OF THE INVENTION

Light output devices utilizing light emitting diodes (LEDs) as their light sources have become increasingly popular. Such light output devices can be used for illumination of objects, for display of an image, or simply for decorative purposes. Applications are for example decorative lighting for shelves, showcases, facades, office partitions, wall claddings.

LEDs are made by embedding LED chips in a package, for example a resin. This allows an improved manufacturability for light output devices utilizing LEDs. Such an embedded LED is also called a LED package.

It is known per se to embed a LED package in a thermoplastic material. The thermoplastic material embedding an LED package therein can be sandwiched between two glass plates to obtain a device called LEDs-in-glass. It is also possible to have an application in which no sandwiching glasses are used. An example is a plastic window in which LED packages are embedded. The embedding of the LED package in a thermoplastic material makes the device more wear resistant. The thermoplastic material prevents LED packages from being damaged and increases electrical safety of the device by covering electrical contacts and wires. Suitable thermoplastic materials in view of manufacturability of the device are for example polyvinyl butyral (PVB) or UV resin.

In such an arrangement, there is a need for controlling the optical and thermal properties for various reasons. For example, LED packages used in light output devices act as point sources resulting in bright spots of light. In LEDs-in-glass, there is a further problem that the light may be captured between the two glass plates due to total internal reflection.

A further problem with a device as described in the introductory paragraph is that the maximum power and light output is limited by the heat generated by the LED chips in the LED packages. The maximum allowed power is especially limited due to the heat insulating properties of the thermoplastic material, resulting in the thermoplastic material obstructing the heat from being conducted away from the LED package. The LED packages may also cause 'hot spots' which may hurt a person while handling the light output device.

US 2007/0025108 A1 discloses a circuit for a lighting installation, which comprises a thermoplastic resin base sheet having a structure in which a light emitting diode device is received in an illuminating position. This resin base sheet contains particles for increasing the heat conductivity. No solution is disclosed for the problem of bright spots.

SUMMARY OF THE INVENTION

It is an object of the invention to provide a light output device in which both the problem relating to heat conductivity and the problem relating to bright spots are reduced.

This object is achieved by the present invention which provides a light output device comprising a LED package at least partly embedded in a translucent layer of a thermoplastic material, wherein the translucent layer comprises light scattering particles having a higher thermal conductivity than the thermal conductivity of the thermoplastic material of the translucent layer.

During use, the light from the LED package traveling through the translucent layer will be scattered by the scattering particles in random directions. This results in that the light leaving the device appears to originate from an area larger than the original emission spot. This has the result that a less bright spot is visible. The light scattering particles have a further function, i.e., the high thermal conductivity of these particles dissipates the heat from the LED package effectively. This reduces the problem relating to the limited maximum power and light output caused by the heat insulation properties of the thermoplastic material. Also, the heat is more evenly distributed, so that the possibility of the occurrence of 'heat spots' is decreased.

It is to be noted that EP 1 737 049 A1 discloses a LED device having a resin in which LED chips are embedded, wherein the resin comprises inorganic nanoparticles This European patent document deals with the problem of heat conduction from LED chips to the surface of the resin. However, the problems relating to bright spots and heat conductivity are not solved when such LED devices are embedded in a translucent layer of a thermoplastic material. It is further noted that US 2003/0218192 A1 discloses a plastic sheet comprising scattering particles. This plastic sheet may be used as cover for LEDs. Such an arrangement still has a problem relating to heat conductivity.

According to a preferred embodiment of the invention, the light scattering particles have a thermal conductivity of at least 1 W/mK, and preferably at least 10 W/mK. Such a thermal conductivity allows an efficient dissipation of heat from the LED package to the outside of the device.

According to a further embodiment of the invention, the light scattering particles have diameters of 100 nm to 2 µm. The light from the LED package is scattered effectively by particles having such diameters According to a further embodiment of the invention, the light scattering particles are selected from a group consisting of $TiO_2$, $ZrO_2$ and MgO. The materials $TiO_2$, $ZrO_2$ and MgO have the thermal conductivity of 11.2, 2, 53.5 W/mK, respectively, and are well suited in view of their low cost.

According to a further embodiment of the invention, the amount of the light-scattering particles is in a range of 0.01-2%, preferably 0.01-0.5% by weight. The degree of scattering may be controlled by the amount of the scattering particles as well as the sizes of the scattering particles. This specified amount of the light scattering particles will result in an effective scattering effect while avoiding a substantial decrease in transmittance.

According to a further embodiment of the invention, the translucent layer further comprises non-light scattering particles having a higher thermal conductivity than the thermal conductivity of the thermoplastic material of the translucent layer.

In some cases, the thermal conductivity of the device may not be optimal when the amount of the particles is optimal for solving the problem of the bright spots. The addition of the non-light scattering particles having higher thermal conductivity than the thermoplastic material allows controlling of the thermal conductivity of the device independently of the light scattering property. It is thereby made possible to increase the thermal conductivity of the device while maintaining the level of light scattering at a desired level. It is to be understood that 'non-light scattering particles' as used herein do not mean that these particles do not cause any light scattering.

According to a further embodiment of the invention, the light scattering particles and the non-light scattering particles are made of a same material. This allows an easy manufacturing of the device.

According to a further embodiment of the invention, the non-light scattering particles have diameters of 1 nm to 50 nm. The scattering property of the particles is greatly reduced when the size of the particles are less than 1/10 of the wavelength of the light. Such diameters are small enough to cause greatly reduced degree of scattering of visible light.

According to a further embodiment of the invention, the amount of the non-light scattering particles is in a range of 2-10%, preferably 5-10% by weight.

According to a further embodiment of the invention, the density of the light scattering particles in a portion closer to the LED package is higher than the density of the light scattering particles in a portion farther away from the LED package. In such an arrangement, the degree of scattering is the highest at the location of the highest light intensity. This allows for obtaining uniformity of the light emitted from the device with lower amount of the light scattering particles compared to when the light scattering particles are distributed evenly over the translucent layer.

According to a further embodiment of the invention, the thermoplastic material is polyvinyl butylal or a UV resin.

According to a further embodiment of the invention, the LED package is embedded in the translucent layer in such a way that the LED package is free from protrusion from the translucent layer. This decreases the risk of the damaging of the LED package.

According to a further embodiment of the invention, the translucent layer is sandwiched between a first glass plate and a second glass plate. The problem of the light being captured between the two glass plates due to total internal reflection is solved because the light is scattered into a random direction by the light scattering particles.

According to a further embodiment of the invention, at least one of the first and the second glass plates is light scattering. This allows even more freedom in controlling the light scattering property of the device. This is achieved by, for example, the at least one of the first and the second glass plates comprising light scattering particles. The light scattering particles in the glass plates may be made of the same material as either of the particles in the translucent layer of thermoplastic material. It is noted, however, that the particles in the glass plates may be made of any material as long as they are light scattering. Alternatively or in addition thereto, the at least one of the first and the second glass plates may be made light scattering by scratching or roughening its surface.

The invention also provides an illumination system comprising a light output device of the invention, and a lighting controller for controlling signals provided to the control circuits.

It is noted that the invention relates to all possible combination of features recited in the claims.

BRIEF DESCRIPTION OF THE DRAWINGS

These and other aspects of the invention will be apparent from and elucidated with reference to the drawings in which.

DETAILED DESCRIPTION OF EMBODIMENTS

It is noted that the same reference numbers have been used for corresponding elements in the embodiments.

Figure 1:
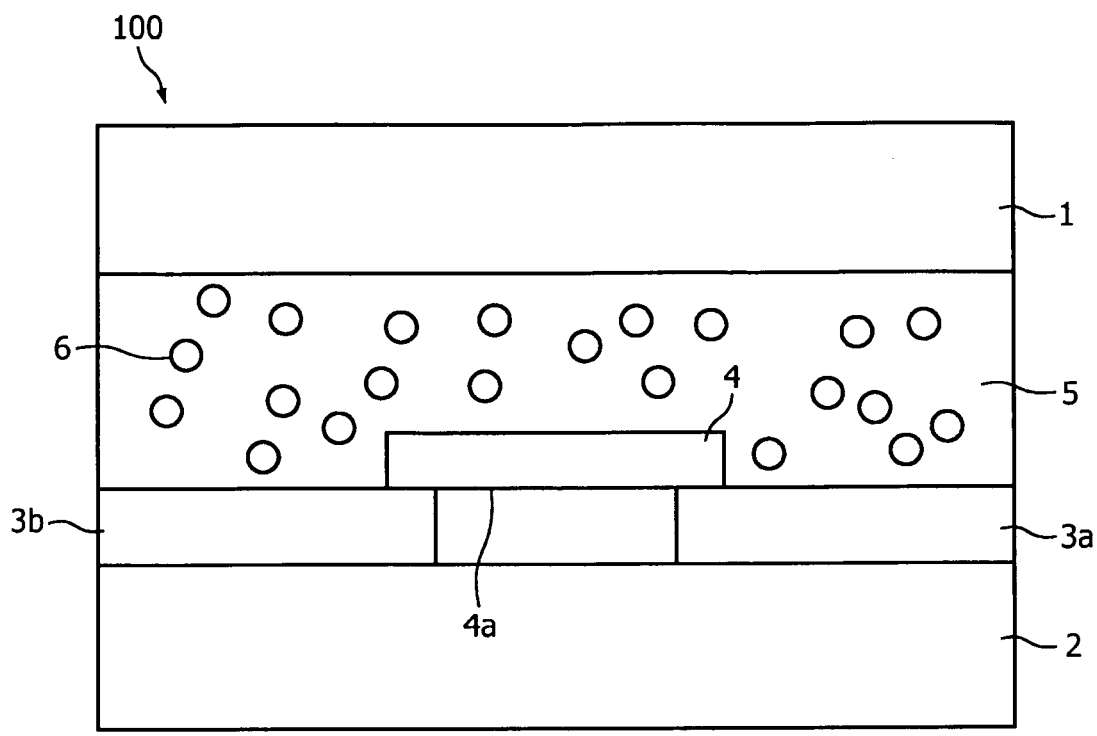
FIG. 1 schematically illustrates a cross section of a first embodiment of the light output device according to the invention.

Referring to FIG. 1, the cross section of a first embodiment of a light output device 100 according to the present invention is shown. The light output device 100 comprises glass plates 1 and 2. A translucent layer 5 of a thermoplastic material is provided between the glass plates 1 and 2. The thermoplastic material may be, for example, polyvinyl butyral (PVB) or a UV resin. A LED package 4, comprising a LED chip, is partly embedded in the translucent layer 5 in such a way that the LED package 4 is covered at all but one side 4a by the translucent layer 5. The LED package 4 is free from protrusion from the translucent layer 5. It is noted that the LED chip as such is not shown in the figure. A part of the side 4a is in contact with electrodes 3a and 3b. The electrodes 3a and 3b may be made of for example indium tin oxide (ITO).

In the translucent layer 5, light scattering particles 6 are embedded having a higher thermal conductivity than the thermal conductivity of the thermoplastic material of the translucent layer 5. The light scattering particles 6 may be made of e.g. $TiO_2$, $ZrO_2$ or MgO. The diameters of the particles 6 are preferably 100 nm to 2 μm for obtaining good light scattering effect.

During use, the light emitted by the LED chip in the LED package 4 will be scattered by the light scattering particles 6 before reaching the glass plates 1, 2 to be emitted outside. This scattering of the light causes less visible bright spot. The amount of the light scattering particles 6 is preferably 1-10% by weight in order to obtain a good light scattering effect while avoiding a substantial decrease in the transmittance of light The LED chip in the LED package 4 emits heat as well as light during use. The heat is conducted from the LED package 4 via the translucent layer 5 and the glass plates 1, 2 to the outside. A problem is that the thermoplastic material of the translucent layer 5 functions more or less as a heat insulator, obstructing the heat from being conducted away from the LED package 4. The light scattering particles 6 embedded in the translucent layer 5 increase the heat conductivity between the LED package 4 and the glass plates 1, 2. The light scattering particles 6 having a higher thermal conductivity than the thermal conductivity of the thermoplastic material of the translucent layer reduce the problems relating to both bright spots and heat insulation.

Figure 2:
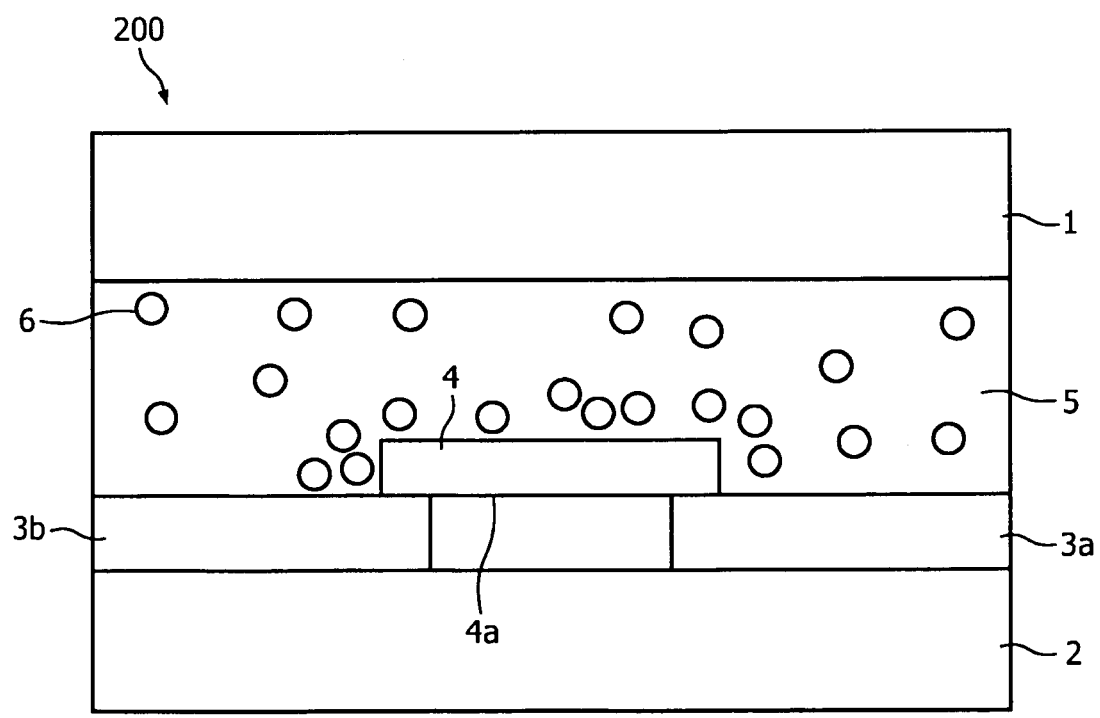
FIG. 2 schematically illustrates a cross section of a second embodiment of the light output device according to the invention.

FIG. 2 shows the cross section of a second embodiment of a light output device 200 according to the present invention. This embodiment is similar to the embodiment shown in FIG. 1 except for the distribution of the light scattering particles 6 embedded in the translucent layer 5. The density of the light scattering particles 6 in a portion closer to the LED package 4 is higher than the density of the light scattering particles 6 in a portion farther away from the LED package 4. In this embodiment, the degree of scattering is the highest at the location of the highest light intensity. This allows for obtaining the same degree of scattering of the emitted light with lower amount of the light scattering particles, resulting in a more uniform distribution of the light emitted from the device.

Figure 3:
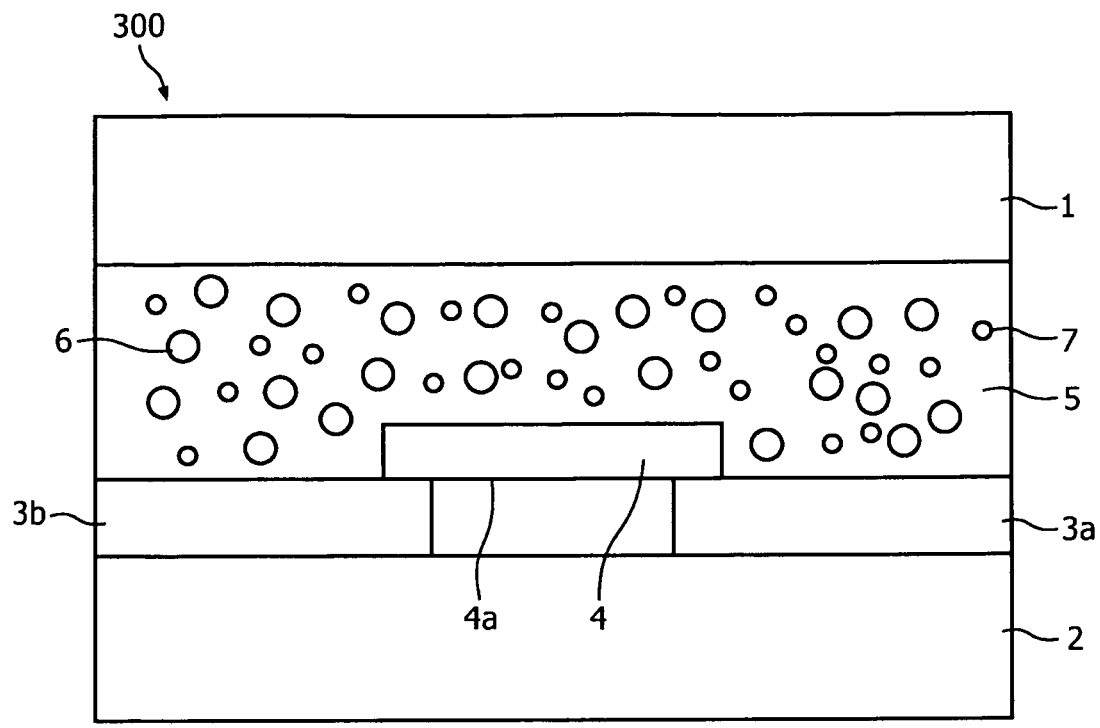
FIG. 3 schematically illustrates a cross section of a third embodiment of the light output device according to the invention.

Referring to FIG. 3, the cross section of a third embodiment of a light output device 300 according to the present invention is shown. This embodiment is similar to the embodiment shown in FIG. 1 except for the further particles 7 embedded in the translucent layer 5. These further particles 7 have a higher thermal conductivity than the thermoplastic material of the translucent layer 5, but are non-light scattering. The particles preferably have diameters of 1-50 nm. The visible light having wavelength of 400 to 800 nm scattered by particles having such a diameter is considerably less than the light scattered by particles with larger diameters. These non-light scattering particles 7 may be made of e.g. $TiO_2$, $ZrO_2$ or MgO. Preferably, the light scattering particles 6 and the non-light scattering particles 7 are made of the same material. The amount of the non-light scattering particles 7 is preferably 5-10% by weight.

The non-light scattering particles 7 increase the heat conductivity between the LED package 4 and the glass plates 1, 2 without further increasing the degree of scattering of the light emitted by the LED chip in the LED package 4. This is advantageous because it is made possible to increase the heat conductivity between the LED package 4 and the glass plates 1, 2 while maintaining the light scattering level to an optimum level.

Figure 4:
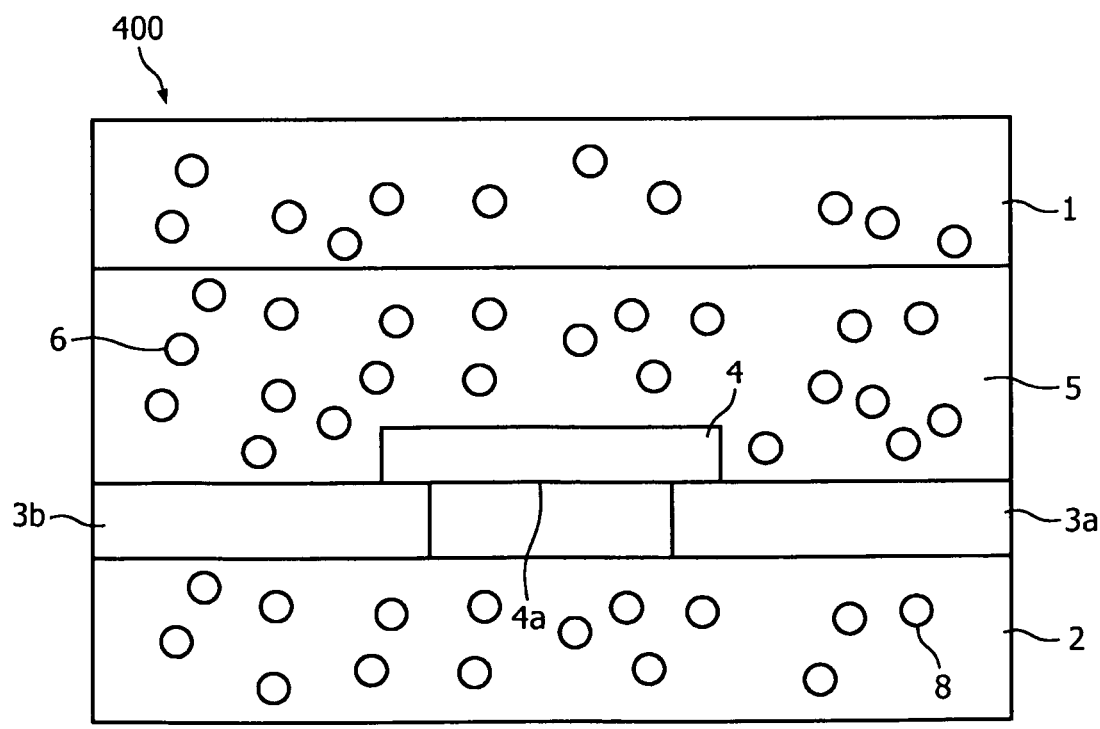
FIG. 4 schematically illustrates a cross section of a fourth embodiment of the light output device according to the invention.

Referring to FIG. 4, the cross section of a fourth embodiment of a light output device 400 according to the present invention is shown. This embodiment is similar to the embodiment shown in FIG. 1 except for the further light scattering particles 8 embedded in the glasses 1, 2. This allows even more freedom in controlling the light scattering property of the device.

Various modifications of the exemplary embodiments described above will be apparent to those skilled in the art. For example, the space between the side 4a and the glass plate 2 may be filled with the same thermoplastic material as the translucent layer 5, instead of air as shown in the examples described above. In such an arrangement, the thermoplastic material in the space 8 may contain the light scattering particles, and if desired, also non-light scattering particles.

It is to be noted that a plurality of LED packages may be embedded in one translucent layer of the light output device according to the present invention. It is also to be noted that the translucent layer may have a multi-layer structure.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention claimed is:

1. A light output device comprising an LED package at least partly embedded in a translucent layer of a thermoplastic material, wherein the translucent layer comprises a plurality of light scattering particles having diameters that are within a range of 100 nm to 2 μm and having a higher thermal conductivity than the thermal conductivity of the thermoplastic material of the translucent layer.

2. A light output device as claimed in claim 1, wherein the light scattering particles have a thermal conductivity of at least 1 W/mK.

3. A light output device as claimed in claim 1, wherein the light scattering particles have a thermal conductivity of at least 10 W/mK.

4. A light output device as claimed in claim 1, wherein the light scattering particles are selected from a group consisting of $TiO_2$, $ZrO_2$ and MgO.

5. A light output device as claimed in claim 1, wherein the amount of the light scattering particles is in a range of 0.01-2% by weight.

6. A light output device as claimed in claim 1, wherein the amount of the light scattering particles is in a range of 0.01-0.5% by weight.

7. A light output device as claimed in claim 1, wherein the thermoplastic material is polyvinyl butylal or a UV resin.

8. A light output device as claimed in claim 1, wherein the LED package is embedded in the translucent layer in such a way that the LED package does not protrude from the translucent layer.

9. A light output device as claimed in claim 1, wherein the translucent layer is sandwiched between a first glass plate and a second glass plate.

* * * * *